(12) United States Patent
Yang et al.

(10) Patent No.: US 9,575,349 B2
(45) Date of Patent: *Feb. 21, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Ji Seong Yang, Seoul (KR); Tae Woo Lim, Hwaseong-si (KR); Kyung Tae Chae, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/505,404

(22) Filed: Oct. 2, 2014

(65) Prior Publication Data

US 2015/0331263 A1 Nov. 19, 2015

(30) Foreign Application Priority Data

May 14, 2014 (KR) ......................... 10-2014-0057674

(51) Int. Cl.
*H01L 29/66* (2006.01)
*G02F 1/1334* (2006.01)
(Continued)

(52) U.S. Cl.
CPC ....... *G02F 1/133377* (2013.01); *G02F 1/1334* (2013.01); *G02F 1/1341* (2013.01);
(Continued)

(58) Field of Classification Search
CPC .... H01L 27/124; H01L 27/1225; H01L 29/41; H01L 29/45; H01L 35/24; H01L 27/12; H01L 27/1259; H01L 29/66; H01L 29/66742; G02F 1/1334; G02F 1/1341; G02F 1/1368; G02F 1/13439; G02F 1/133377
See application file for complete search history.

(56) References Cited

U.S. PATENT DOCUMENTS

2004/0041147 A1* 3/2004 Park .................... H01L 51/5256
257/40
2012/0062448 A1* 3/2012 Kim .................. G02F 1/133377
345/55

(Continued)

FOREIGN PATENT DOCUMENTS

CN 103424939 A 12/2013
JP 2013-242556 12/2013

(Continued)

OTHER PUBLICATIONS

Hong et al., U.S. Appl. No. 14/456,247, filed Aug. 11, 2014, titled "Liquid Crystal Display and Method of Manufacturing the Same".

(Continued)

*Primary Examiner* — Fazli Erdem
(74) *Attorney, Agent, or Firm* — Innovation Counsel LLP

(57) ABSTRACT

A liquid crystal display according to an exemplary embodiment includes: a substrate; a thin film transistor disposed on the substrate; a pixel electrode connected with the thin film transistor; a roof layer provided facing the pixel electrode; and a capping layer disposed on the roof layer, wherein a plurality of microcavities are between the pixel electrode and the roof layer, each microcavity includes a liquid crystal material, and the roof layer is formed of only at least one inorganic layer.

20 Claims, 16 Drawing Sheets

(51) Int. Cl.
*G02F 1/1343* (2006.01)
*G02F 1/1333* (2006.01)
*G02F 1/1368* (2006.01)
*G02F 1/1341* (2006.01)

(52) U.S. Cl.
CPC ........ *G02F 1/1368* (2013.01); *G02F 1/13439* (2013.01); *H01L 29/66742* (2013.01)

(56) References Cited

U.S. PATENT DOCUMENTS

| | | | |
|---|---|---|---|
| 2013/0250220 A1 | 9/2013 | Kim et al. | |
| 2013/0308071 A1 | 11/2013 | Kim et al. | |
| 2013/0321734 A1 | 12/2013 | Won et al. | |
| 2013/0335664 A1* | 12/2013 | Shim | G02F 1/1339 349/43 |
| 2014/0009712 A1 | 1/2014 | Minowa | |
| 2014/0111746 A1 | 4/2014 | Kim et al. | |
| 2014/0267966 A1 | 9/2014 | Won | |
| 2014/0293193 A1 | 10/2014 | Lim | |
| 2014/0293205 A1 | 10/2014 | Kim et al. | |
| 2014/0346504 A1* | 11/2014 | Misaki | H01L 21/0217 257/43 |
| 2014/0354921 A1* | 12/2014 | Lee | G02F 1/1341 349/89 |
| 2014/0354922 A1* | 12/2014 | Sung | G02F 1/1334 349/92 |
| 2015/0015824 A1 | 1/2015 | Lee | |
| 2015/0070631 A1 | 3/2015 | Prushinskiy | |
| 2015/0092131 A1 | 4/2015 | Lee | |
| 2015/0234214 A1* | 8/2015 | Hong | G02F 1/1334 349/43 |
| 2016/0116794 A1 | 4/2016 | Song et al. | |
| 2016/0170254 A1* | 6/2016 | Chae | G02F 1/13394 349/43 |

FOREIGN PATENT DOCUMENTS

| | | |
|---|---|---|
| KR | 1020030082144 A | 10/2003 |
| KR | 1020130129008 A | 11/2013 |
| KR | 1020140112288 A | 9/2014 |

OTHER PUBLICATIONS

Hong et al., U.S. Appl. No. 14/603,082, filed Jan. 22, 2015, titled "Liquid Crystal Display and Method of Manufacturing the Same".

European Search Report, EP Application No. 15155167.8, May 28, 2015, 9 pages.

* cited by examiner

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2014-0057674 filed in the Korean Intellectual Property Office on May 14, 2014, the entire contents of which are incorporated herein by reference.

BACKGROUND (a) Field

The present application relates to a liquid crystal display and a manufacturing method thereof.

(b) Description of the Related Art

A liquid crystal display is one of flat panel displays which are currently most widely used, and includes two sheets of display panels in which field generating electrodes such as a pixel electrode and a common electrode are formed, and a liquid crystal layer interposed therebetween.

The liquid crystal display displays an image by applying a voltage to the field generating electrodes to generate an electric field in the liquid crystal layer, thereby determining an orientation of liquid crystal molecules of the liquid crystal layer based on the generated electric field and controlling polarization of incident light.

As one of the liquid crystal displays, a technology for implementing a display by forming a plurality of microcavities and filling liquid crystal in the microcavities has been developed. In a conventional liquid crystal display, two sheets of substrates are used, but in this technology, constituent elements are formed on one substrate, thereby reducing weight, thickness, and the like of the device.

In order to maintain the microcavities in the display device, a roof layer is formed. Such a roof layer may be continuously connected between neighboring microcavities. The roof layer may be formed as a complex layer of an inorganic layer and an organic layer.

As described, when the roof layer is formed as the complex layer of the inorganic layer and the organic layer, the number of masks is increased so that processing time is increased.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a liquid crystal display that can reduce a processing time, and a method for manufacturing the same.

A liquid crystal display according to an exemplary embodiment includes: a substrate; a thin film transistor disposed on the substrate; a pixel electrode connected with the thin film transistor; a roof layer provided facing the pixel electrode; and a capping layer disposed on the roof layer, wherein a plurality of microcavities are between the pixel electrode and the roof layer, each microcavity includes a liquid crystal material, and the roof layer is formed of only at least one inorganic layer.

The roof layer comprises a structure in which a first inorganic layer and a second inorganic layer, each having a different stress, are layered.

The first inorganic layer may have a compressive stress and the second inorganic layer may have a tensile stress.

The first inorganic layer and the second inorganic layer may be alternately layered, and the roof layer may include at least one of the first inorganic layer and the second inorganic layer.

A thickness of the first inorganic layer and a thickness of the second inorganic layer may be gradually increased farther away from the plurality of microcavities.

The liquid crystal display may further include a common electrode disposed between the plurality of microcavities and the roof layer.

A partition wall formation portion may be disposed between the plurality of microcavities, and the partition wall formation portion may be covered with the capping layer.

The partition wall formation portion may be along a direction in which a data line connected to the thin film transistor extends.

A liquid crystal injection hole forming area may be disposed between the plurality of microcavities, and the capping layer may cover the liquid crystal injection hole forming area.

The liquid crystal injection hole forming area may be along a direction in which a gate line connected to the thin film transistor extends.

The liquid crystal display may further include a common electrode disposed between the plurality of microcavities and the roof layer, wherein the common electrode, the roof layer, and the capping layer are sequentially disposed.

According to another exemplary embodiment, a method for manufacturing a liquid crystal display is provided. The method includes: forming a thin film transistor on a substrate; forming a pixel electrode connected with the thin film transistor; forming a sacrificial layer on the pixel electrode; forming a roof layer on the sacrificial layer; partially exposing the sacrificial layer by patterning the roof layer; forming a plurality of microcavities by removing the sacrificial layer; injecting a liquid crystal material into the plurality of microcavities; and forming a capping layer to cover liquid crystal injection holes of the plurality of microcavities, wherein the roof layer is formed of only at least one inorganic layer.

The forming the roof layer may include sequentially layering a first inorganic layer and a second inorganic layer, each having a different stress.

The first inorganic layer may be made of a material having a compressive stress and the second inorganic layer may be made of a material having a tensile stress.

The forming the roof layer may include alternately layering the first inorganic layer and the second inorganic layer, and the roof layer may include at least one of the first inorganic layer and the second inorganic layer.

When forming the roof layer, a thickness of the first inorganic layer and a thickness of the second inorganic layer may be gradually decreased farther away from the plurality of microcavities.

The method may further include forming a common electrode provided between the sacrificial layer and the roof layer.

A partition wall formation portion may be formed along a direction in which a data line connected to the thin film transistor, the partition wall formation portion being formed between the plurality of microcavities, and the capping layer may cover the partition wall formation portion.

When partially exposing the sacrificial layer by patterning the roof layer, a liquid crystal injection hole forming area may be formed along a direction in which a gate line connected to the thin film transistor extends, and the capping layer may cover the liquid crystal injection hole forming area.

The method may further include forming a common electrode on the sacrificial layer, wherein the common electrode and the roof layer are patterned using one mask.

According to the exemplary embodiments, a process can be simplified by forming a roof layer only with one or more inorganic layers. In addition, when the roof layer is formed with inorganic layers, each having a different stress, the roof layer is prevented from being lifted around a liquid crystal inlet hole.

DETAILED DESCRIPTION OF THE EMBODIMENTS

Figure 1:
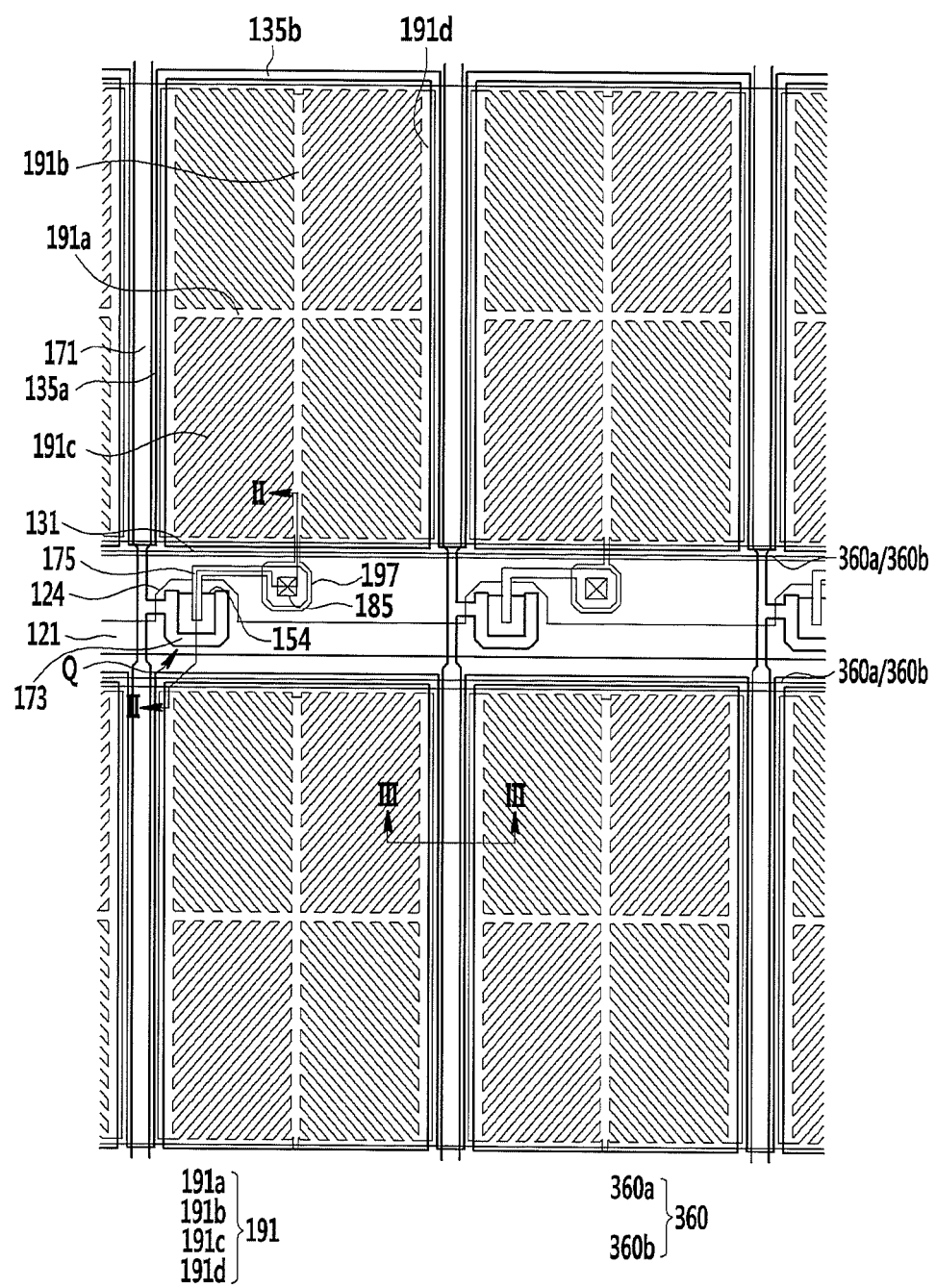
FIG. 1 is a top plan view of a liquid crystal display according to an exemplary embodiment.

Exemplary embodiments will now be described with reference to the accompanying drawings. As those skilled in the art would realize, the described embodiments may be modified in various different ways, all without departing from the spirit or scope of the inventive concept. On the contrary, exemplary embodiments introduced herein are provided to make disclosed contents thorough and complete and sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening layers or substrates may also be present. Like reference numerals designate like elements throughout the specification.

Figure 2:
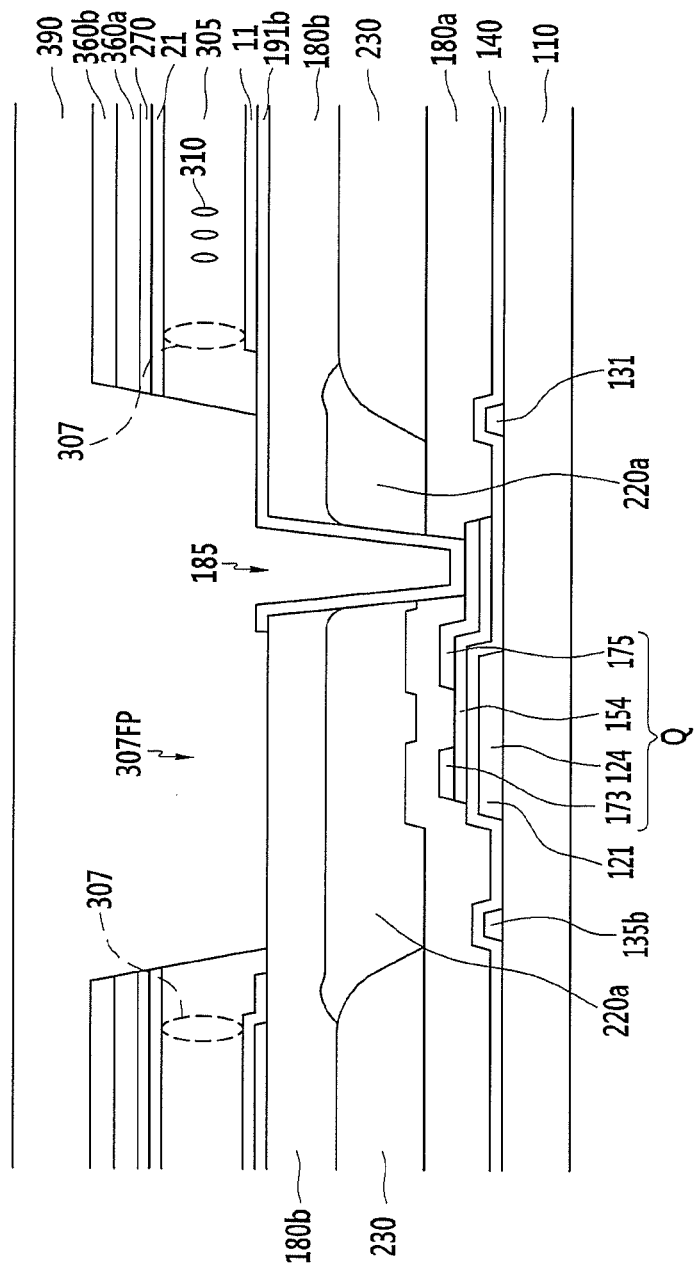
FIG. 2 is a cross-sectional view of the liquid crystal display of FIG. 1, taken along the line II-II.
Figure 3:
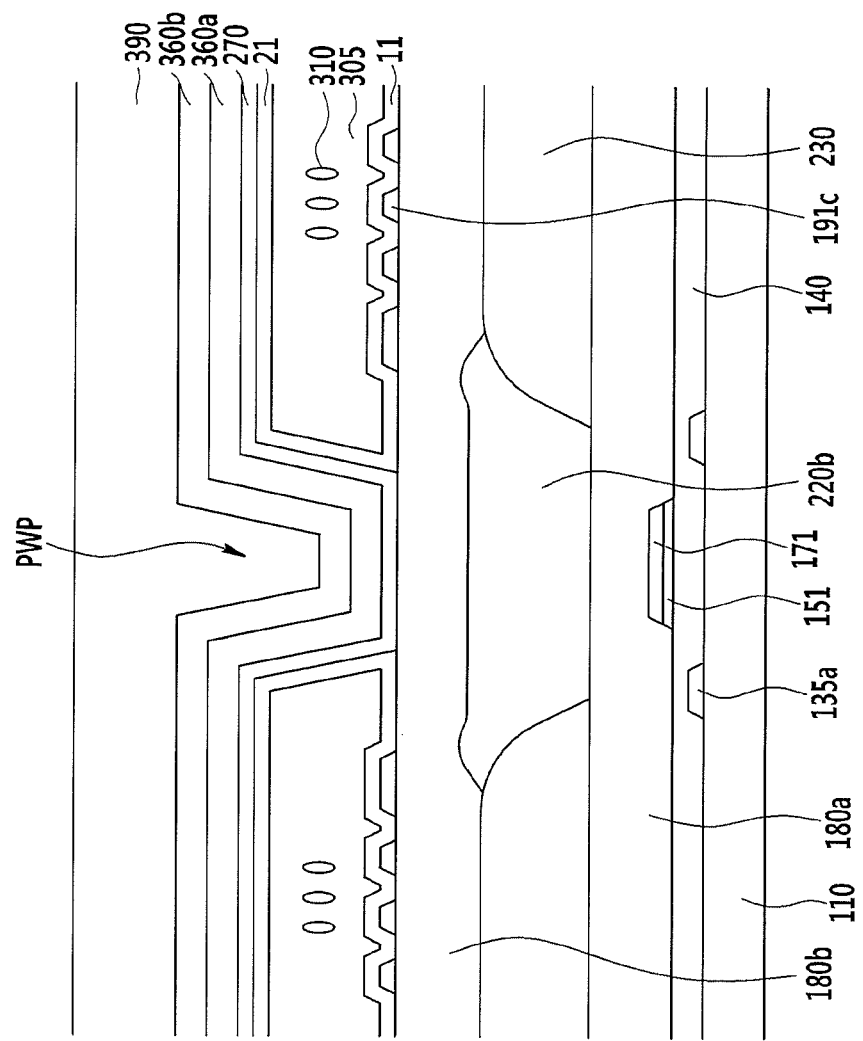
FIG. 3 is a cross-sectional view of the liquid crystal display of FIG. 1, taken along the line III-III.

FIG. 1 is a layout view of a liquid crystal display according to an exemplary embodiment. FIG. 2 is a cross-sectional view of the liquid crystal display of FIG. 1, taken along the line II-II. FIG. 3 is a cross-sectional view of the liquid crystal display of FIG. 1, taken along the line III-III.

FIG. 1 shows a 2*2 pixel, which is a part of a plurality of pixels, and such pixels may be iteratively arranged in up, down, left, and right directions in the liquid crystal display according to the exemplary embodiment.

Referring to FIG. 1 to FIG. 3, gate lines 121 and storage electrode lines 131 are formed on a substrate 110 that is made of transparent glass or plastic. The gate lines 121 include a gate electrode 124. The storage electrode lines 131 substantially extend in a horizontal direction, and transmit a constant voltage such as a common voltage Vcom. The storage electrode lines 131 include a pair of vertical portions 135a substantially extending perpendicularly to the gate line 121 and a pair of horizontal portions 135b connecting ends of the pair of vertical portions 135a with each other. The storage electrodes 135a and 135b may have a structure that surrounds a pixel electrode 191.

A gate insulating layer 140 is formed on the gate lines 121 and the storage electrode lines 131. A linear semiconductor layer 151 provided in a lower portion of a data line 171 and a semiconductor layer 154 provided below source/drain electrodes and a channel area of a thin film transistor Q are formed on the gate insulating layer 140. The linear semiconductor layer 151 and the semiconductor layer 154 that corresponds to the lower portion of the source/drain electrodes and the channel area may be connected with each other.

A plurality of ohmic contacts (not shown) may be formed between the linear semiconductor layer 151 and the data line 171 and between the semiconductor layer 154 that corresponds to the lower portion of the source/drain electrodes and the channel area and the source/drain electrodes.

Data conductors 171, 173, and 175 including a source electrode 173, the data line 171 connected with the source electrode 173, and a drain electrode 175 are fainted on each of the semiconductor layers 151 and 154 and the gate insulating layer 140.

The gate electrode 124, the source electrode 173, and the drain electrode 175 form the thin film transistor Q together with the semiconductor layer 154, and a channel of the thin film transistor Q is formed in an exposed portion of the semiconductor layer 154 between the source electrode 173 and the drain electrode 175.

A first interlayer insulating layer 180a is formed on the data conductors 171, 173, and 175 and the exposed portion of the semiconductor layer 154. The first interlayer insulating layer 180a may include an inorganic insulator such as a silicon nitride (SiNx) and a silicon oxide (SiOx), or an organic insulator.

A color filer 230 and light blocking members 220a and 220b are formed on the first interlayer insulating layer 180a.

First, the light blocking members 220a and 220b are formed in a lattice structure having an opening that corresponds to an image display area, and are made of a material which does not transmit light. The color filter 230 is formed in the opening of the light blocking members 220a and 220b. The light blocking members 220a and 220b include a horizontal light blocking member 220a formed along a direction that is parallel with the gate line 121 and a vertical light blocking member 220b formed along a direction that is parallel with the date line 171.

The color filter 230 displays one of primary colors such as three primary colors of red, green, and blue. The color filter 230 is not limited to the three primary colors of red, green, and blue, but may display cyan, magenta, yellow, and white-based colors. The color filter 230 may be made of a material displaying different colors for each pixel adjacent to each other.

A second interlayer insulating layer 180b covering the color filter 230 and the light blocking members 220a and 220b is formed on the color filter 230 and the light blocking members 220a and 220b. The second interlayer insulating layer 180b may include an inorganic insulator such as a silicon nitride (SiNx) and a silicon oxide (SiOx), or an organic insulator. Unlike as shown in FIG. 2, when a step is formed due to a thickness difference between the color filter 230 and the light blocking members 220a and 220b, the second interlayer insulating layer 180b is set to include an organic insulator so as to reduce or remove the step.

Contact holes 185 that extend to and expose the drain electrode 175 may be formed in the color filter 230, the light blocking members 220a and 220b, and the interlayer insulating layers 180a and 180b.

The pixel electrode 191 is formed on the second interlayer insulating layer 180b. The pixel electrode 191 may be made of a transparent conductive material such as ITO or IZO.

The pixel electrode 191 is formed in the shape of a quadrangle, and includes cross stem portions including horizontal stem portions 191a and vertical stem portions 191b. In addition, the pixel electrode 191 is divided into four sub-areas by the horizontal stem portions 191a and the vertical stem portions 191b, and each sub-area includes a plurality of minute stem portions 191c. Further, in the present exemplary embodiment, the pixel electrode 191 may include outer edge stem portions 191d connecting the minute stem portions 191c from right and left outer edges. In the present exemplary embodiment, the outer edge stem portions 191d are disposed in the right and left outer edges of the pixel electrode 191, but they may extend to an upper or lower portion of the pixel electrode 191.

The minute stem portions 191c of the pixel electrode 191 form an angle of about 40 degrees or 45 degrees with the gate line 121 or the horizontal stem portion 191a. In addition, minute stem portions 191c of two neighboring sub-areas may be perpendicular to each other. Further, the width of the minute stem portions 191c may be gradually increased, or gaps between the minute stem portions 191c may be different from each other.

The pixel electrode 191 includes an extension portion 197 connected from a lower end of the vertical stem portion 191b and that has a wider area than the vertical stem portion 191b. The extension portion 197 of the pixel electrode 191 is physically and electrically connected with the drain electrode 175 through the contact hole 185, and receives a data voltage from the drain electrode 175.

The description of the thin film transistors Q and the pixel electrode 191 described above is one example, and the structure of the thin film transistors and the design of the pixel electrode may be modified to enhance side visibility.

A lower alignment layer 11 is formed on the pixel electrode 191, and the lower alignment layer 11 may be a vertical alignment layer. The lower alignment layer 11 may include at least one of materials generally used as a liquid crystal alignment layer such as polyamic acid, a polysiloxane, a polyimide, or the like. In addition, the lower alignment layer 11 may be a photo-alignment layer.

An upper alignment layer 21 is disposed in a portion that is opposite to the lower alignment layer 11, and a microcavity 305 is formed between the lower alignment layer 11 and the upper alignment layer 21. A liquid crystal material including liquid crystal molecules 310 is injected into the microcavity 305, and the microcavity 305 includes a liquid crystal injection hole 307. In the present exemplary embodiment, an alignment material forming the alignment layers 11 and 21 and a liquid crystal material including the liquid crystal molecules 310 may be injected into the microcavity 305 using capillary force.

The microcavity 305 may be formed as a plurality of microcavities 305 by being vertically divided by a plurality of liquid crystal injection hole forming areas 307FP provided in a portion that overlaps the gate line 121, and the plurality of microcavities 305 may be formed along a column direction, i.e., a vertical direction, of the pixel electrode 191. In addition, the microcavity 305 may be formed as a plurality of microcavities 305 by being horizontally divided by a partition wall formation portion PWP, and the plurality of microcavities 305 may be formed along a row direction of the pixel electrode 191, that is, a horizontal direction in which the gate line 121 is extended. Each of the plurality of microcavities 305 may correspond to each of the pixel areas or two or more pixel areas, and the pixel areas may correspond to the image display area.

The liquid crystal injection hole forming areas 307FP, sometimes called the liquid crystal injection hole forming region 307FP, may extend along a direction in which the gate line 121 extends. The liquid crystal injection hole forming region 307FP may vertically partition the microcavity 305, and may be an empty space where a common electrode 270 and a roof layer 360 are removed. The liquid crystal injection hole forming region 307FP may be covered by the alignment layers 11 and 21 and a capping layer 390 after injection of the liquid crystal material that includes the liquid crystal molecules 310.

The liquid crystal injection hole forming region 30/FP may be a path for injection of an alignment material or a liquid crystal material to the microcavity 305 through the liquid crystal injection hole 307 by being filled with the alignment material or the liquid crystal material.

The common electrode 270 and the roof layer 360 are provided on the upper alignment layer 21. The common electrode 270 receives a common voltage, and forms an electric field with the pixel electrode 191 to which the data voltage is applied so as to determine an inclination direction of the liquid crystal molecules 310 in the microcavity 305 between the common electrode 270 and the pixel electrode 191. The common electrode 270 may be made of a transparent conductive material such as ITO or IZO. The common electrode 270 forms a capacitor with the pixel electrode 191 and maintains an applied voltage even after the thin film transistor Q is turned off.

The roof layer 360 is an inorganic insulating layer made of an inorganic material such as a silicon nitride ($SiN_x$) or a silicon oxide ($SiO_x$). As shown in FIG. 2 and FIG. 3, the roof layer 360 according to the exemplary embodiment may include a first inorganic layer 360a and a second inorganic layer 360b provided on the first inorganic layer 360a. The first inorganic layer 360a and the second inorganic layer 360b may have different stresses. For example, the first inorganic layer 360a may have a compressive stress and the second inorganic layer 360b may have a tensile stress. Alternatively, the first inorganic layer 360a may have a tensile stress and the second inorganic layer 360b may have a compressive stress. As in the present exemplary embodiment, the roof layer 360 has inorganic layers respectively having different stress characteristics to thereby control stress of the roof layer 360. Therefore, deformation of the roof layer 360 can be minimized.

The roof layer 360 supports a structure of the microcavity 305 for the microcavity 305 between the pixel electrode 191 and the common electrode 270 to maintain its shape. In order to support the structure of the microcavity 305, in the present exemplary embodiment, the roof layer 360 formed of only the inorganic layer may have a thickness of about 4000 Å or more, and more preferably, the roof layer 360 may have a thickness between 6000 Å and 12,000 Å.

In the present exemplary embodiment, the roof layer 360 may be formed throughout the substrate 110, except for a portion that is removed from the liquid crystal injection hole forming region 307FP.

Hereinafter, the roof layer 360 according to the exemplary embodiment will be described in detail with reference to FIG. 4 to FIG. 6.

According to the exemplary embodiment, unlike a conventional art, a process can be simplified by forming the roof layer 360 with only the inorganic layer without using an organic layer.

Figure 4:
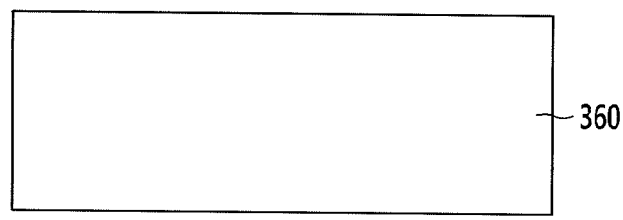
FIG. 4 is a schematic cross-sectional view of a roof layer according to an exemplary embodiment.

Referring to FIG. 4, the roof layer 360 between the common electrode 270 and the capping layer 390 can be formed of a single inorganic layer. When the roof layer 360 is formed of a single inorganic layer, an inorganic layer having a tensile stress may have a thickness of about 6000 Å or more and less than 12,000 Å.

Figure 5:
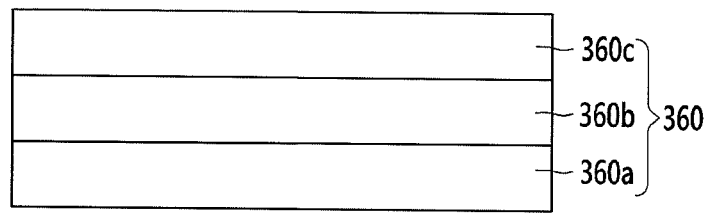
FIG. 5 is a schematic cross-sectional view illustrating the roof layer according to an exemplary embodiment.

Referring to FIG. 5, a first inorganic layer 360a, a second inorganic layer 360b, and a third inorganic layer 360c are sequentially layered such that the roof layer 360 is formed. In this case, the first inorganic layer 360a may have a compressive stress, the second inorganic layer 360b may have a tensile stress, and the third inorganic layer 360c may have a compressive stress. Alternatively, the first inorganic layer 360a may have a tensile stress, the second inorganic layer 360b may have a compressive stress, and the third inorganic layer 360c may have a tensile stress. In other words, the first inorganic layer 360a and the third inorganic layer 360c may have the same type of stress in the present exemplary embodiment.

Although it is exemplarily illustrated that the roof layer 360 has a three-layered structure in the present exemplary embodiment, this is not restrictive. Inorganic layers each having a different type of stress may be alternatively layered such that the roof layer 360 may be formed.

Figure 6:
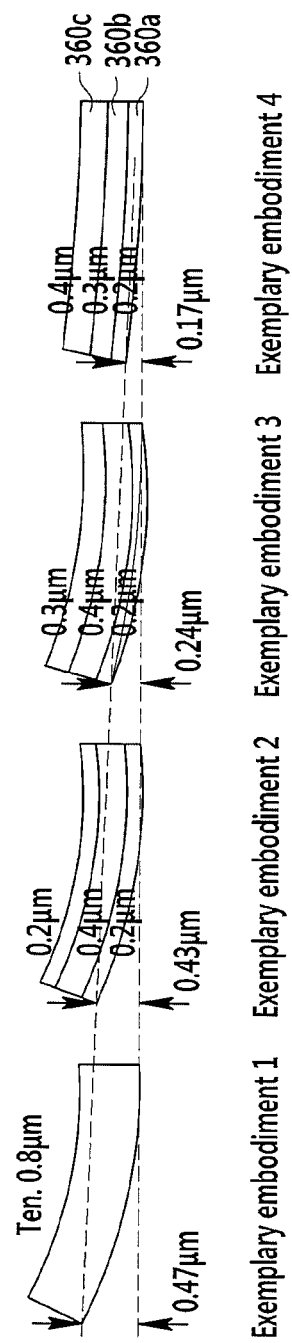
FIG. 6 shows the degree of lift of a roof layer around a liquid crystal injection hole according to a thickness variation according to exemplary embodiments.

FIG. 6 shows the degree of lift of the roof layer around a liquid crystal injection hole according to a thickness variation according to exemplary embodiments. In FIG. 6, the thicknesses marked by the arrows indicate portions where the roof layers 360 are lifted at a location that is adjacent to the liquid crystal injection hole forming region 307FP in FIG. 2.

Referring to FIG. 6, in Exemplary Embodiment 1, a single inorganic layer having a tensile stress is formed with a thickness of 0.8 μm. In Exemplary Embodiment 2, a first inorganic layer 360a having a compressive stress is formed with a thickness of 0.2 μm, a second inorganic layer 306b having a tensile stress is formed with a thickness of 0.4 μm, and a third inorganic layer 360c having a compressive stress is formed with a thickness of 0.2 μm. In Exemplary Embodiment 3, a first inorganic layer 360a having a compressive stress is formed with a thickness of 0.2 μm, a second inorganic layer 360b having a tensile stress is formed with a thickness of 0.4 μm, and a third inorganic layer 360c having a compressive stress is formed with a thickness of 0.3 μm. In Exemplary Embodiment 4, a first inorganic layer 360a having a compressive stress is formed with a thickness of 0.2 μm, a second inorganic layer 360b having a tensile stress is formed with a thickness of 0.3 μm, and a third inorganic layer 360c having a compressive force is formed with a thickness of 0.4 μm.

In Exemplary Embodiment 1, an inlet is lifted by 0.47 μm. In Exemplary Embodiment 2, Exemplary Embodiment 3, and Exemplary Embodiment 4, the degree of lift of the inlet is reduced to be less than 0.45 μm when the roof layer 360 is formed by alternatingly layering inorganic layers respectively having different stress. In detail, the inlet is lifted by 0.43 μm in Exemplary Embodiment 2, the inlet is lifted by 0.24 μm in Exemplary Embodiment 3, and the inlet is lifted by 0.17 μm in Exemplary Embodiment 4. That is, inlet lift can be minimized by controlling the thickness and stress of the inorganic layers.

In the present exemplary embodiment, the side of each of the common electrode 270 and the roof layer 360 are exposed in the liquid crystal injection hole forming region 307FP, and the exposed sides are engaged with each other. In other words, the side edge of the common electrode 270 and the side edge of the roof layer 360 are aligned.

In the present exemplary embodiment, the common electrode 270 is formed in an upper end of the microcavity 305, but the common electrode 270 may be formed in a lower portion of the microcavity 305 thereby enabling liquid crystal driving according to an in-plane switching mode in another exemplary embodiment.

Referring back to FIG. 2, the capping layer 390 is disposed on the roof layer 360. The capping layer 390 includes an organic material or an inorganic material. In the present exemplary embodiment, the capping layer 390 may contact an upper surface of the roof layer 360 formed of only inorganic layers. The capping layer 390 may be provided not only in an upper portion of the roof layer 360 but also in the liquid crystal injection hole forming region 307FP. In this case, the capping layer 390 may cover the liquid crystal injection hole 307 of the microcavity 305, exposed by the liquid crystal injection hole forming region 307FP. In the present exemplary embodiment, it is illustrated that the liquid crystal material is removed in the liquid crystal injection hole forming region 307FP, but a residue of the liquid crystal material after injection into the microcavity 305 may remain in the liquid crystal injection hole forming region 307FP.

As shown in FIG. 3, in the present exemplary embodiment, the partition wall formation portion PWP is formed between horizontally neighboring microcavities 305. The partition wall formation portion PWP may extend along the data line 171, and may be covered by the capping layer 390. The partition wall formation portion PWP may partition or define the microcavities 305 along a horizontal direction. In the present exemplary embodiment, the partition wall formation portion PWP structure is formed between the microcavities 305, and therefore less stress is generated even through the substrate 110 is bent, and the degree of modification of a cell gap may be significantly reduced.

Figure 7:
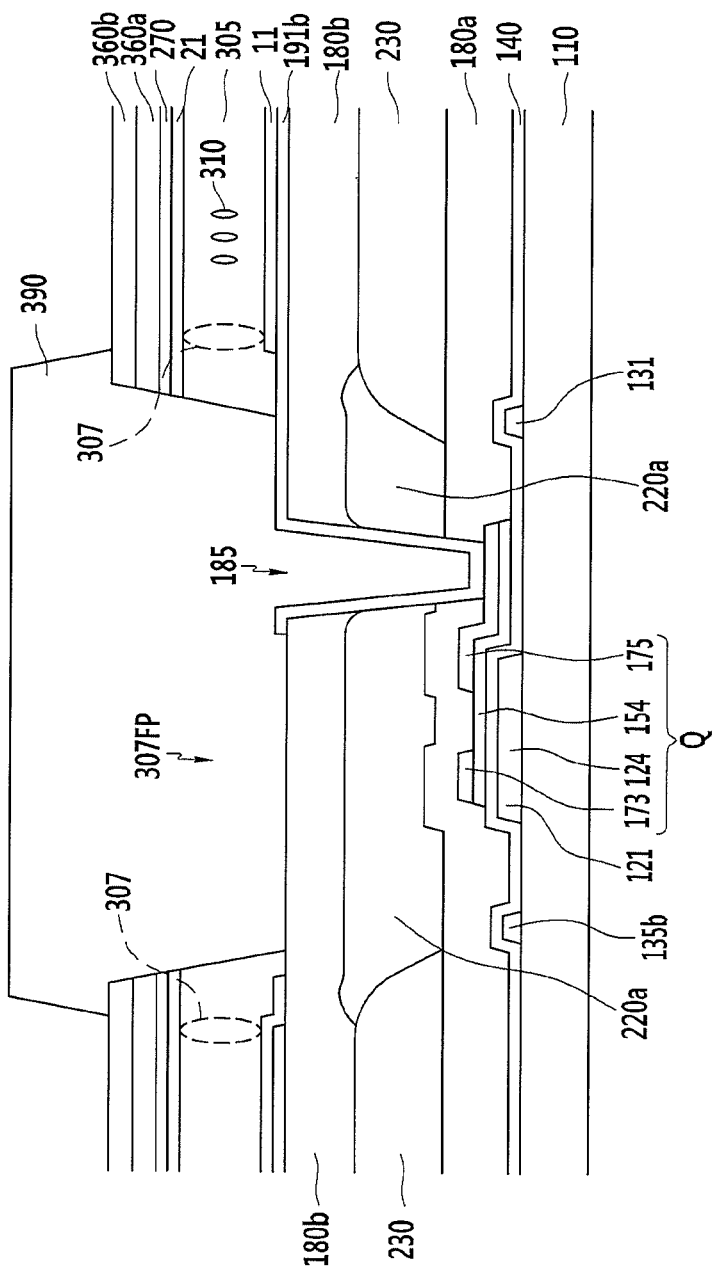
FIG. 7 and FIG. 8 are cross-sectional views of an exemplary variation of the exemplary embodiment of FIG. 2.
Figure 8:
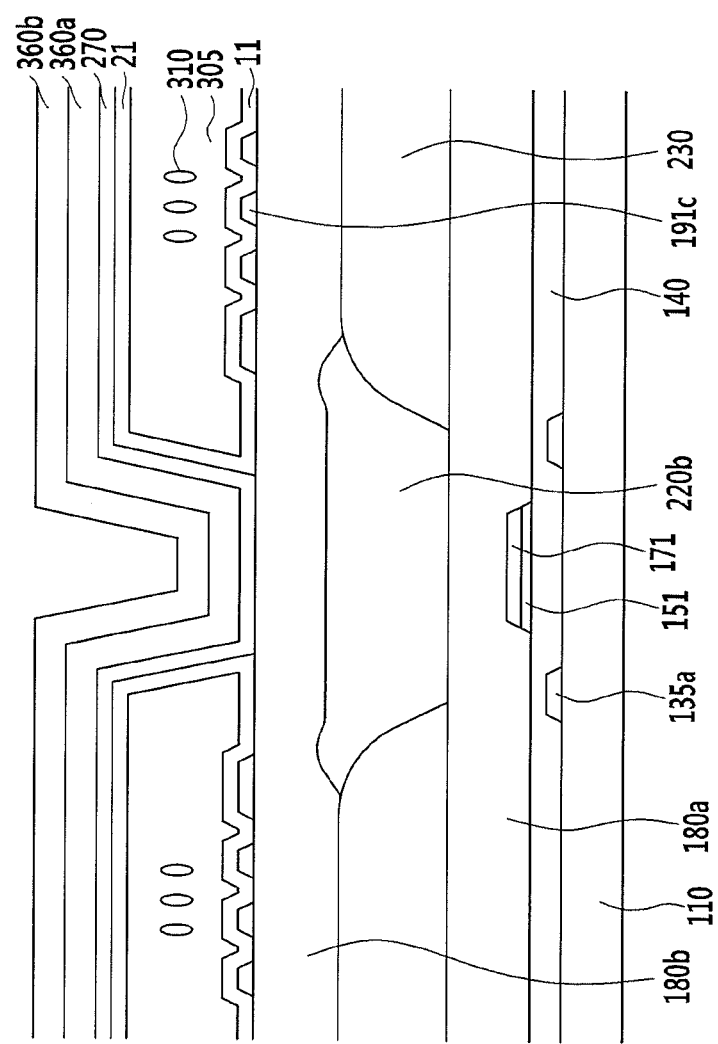

FIG. 7 and FIG. 8 are cross-sectional views of an exemplary variation of the exemplary embodiment of FIG. 2. FIG. 7 is a cross-sectional view of FIG. 1, taken along the line II-II, and FIG. 8 is a cross-sectional view of FIG. 1, taken along the line III-III.

Referring to FIG. 1, FIG. 7, and FIG. 8, the exemplary variation is similar to the exemplary embodiment of FIG. 2, except that a capping layer 390 is not formed throughout a roof layer 360 but the capping layer 390 covers a liquid crystal injection hole forming region 307FP. In detail, the capping layer 390 is formed only in a portion corresponding to the liquid crystal injection hole forming region 307FP, and is not formed in a portion corresponding to a pixel area. In the present exemplary embodiment, the capping layer 390 may extend along a direction of a gate line 121.

Hereinafter, an exemplary embodiment of a method for manufacturing the above-stated liquid crystal display will be described with reference to FIG. 9 to FIG. 17. The exemplary embodiment to be described below is an exemplary embodiment of the manufacturing method and may be modified in another form.

FIG. 9 to FIG. 17 are cross-sectional views of a manufacturing method of the liquid crystal display according to an exemplary embodiment.

FIG. 9, FIG. 11, FIG. 13, FIG. 14, and FIG. 16 sequentially illustrate cross-sectionals views of the liquid crystal display of FIG. 1, taken along the line II-II. FIG. 10, FIG. 12, FIG. 15, and FIG. 17 are cross-sectional views of the liquid crystal display of FIG. 1, taken along the line III-III.

Figure 9:
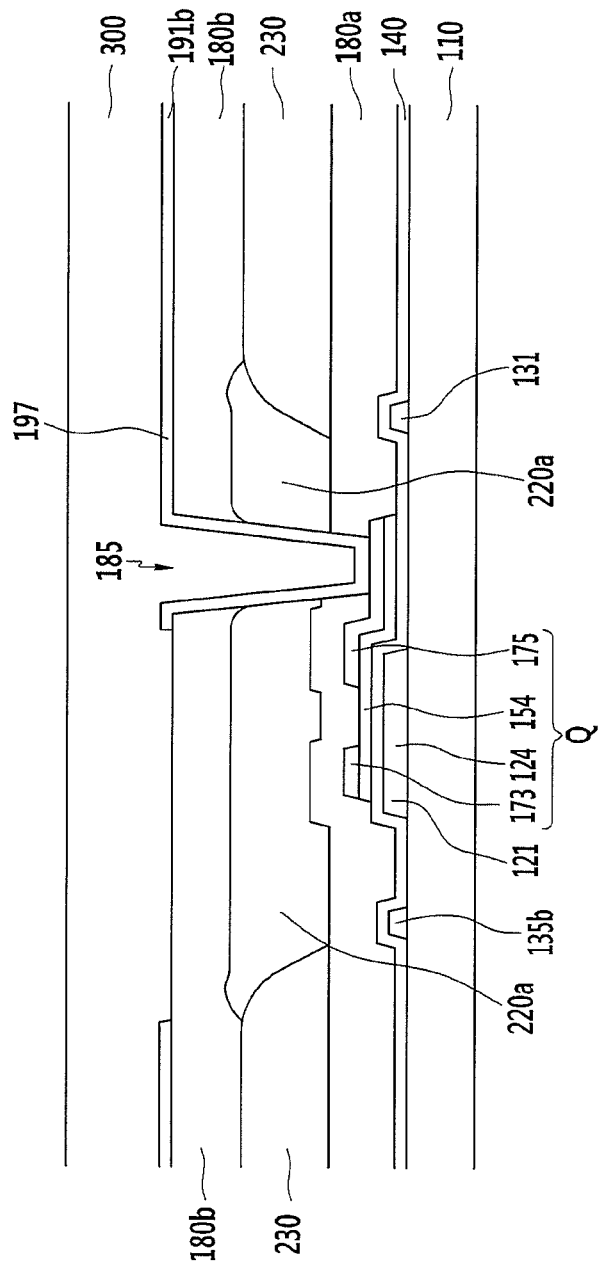
FIGS. 9, 10, 11, 12, 13, 14, 15, 16, 17 are cross-sectional views of a method for manufacturing a liquid crystal display according to an exemplary embodiment.
Figure 10:
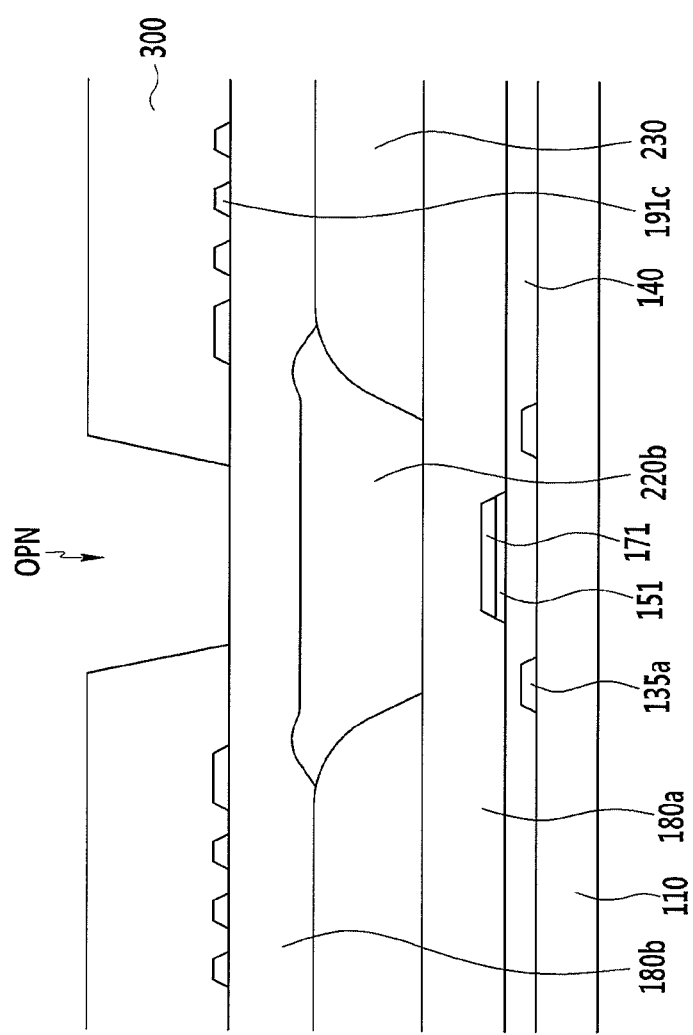

Referring to FIG. 1, FIG. 9, and FIG. 10, gate lines 121 extending in a horizontal direction for forming a generally-known switching element, a gate insulating layer 140 formed on the gate line 121, semiconductor layers 151 and 154 formed on the gate insulating layer 140, and a source electrode 173 and a drain electrode 175 are formed on a substrate 110. In this case, the data line 171 connected with the source electrode 173 may extend in a vertical direction while crossing the gate line 121.

A first interlayer insulating layer 180a is formed on data conductors 171, 173, and 175 including the source electrode 173, the drain electrode 175, and the data line 171, and the exposed semiconductor 154.

A color filter 230 is formed corresponding to a pixel area on the first interlayer insulating layer 180a, and light blocking members 220a and 22b are formed between color filters 230. The light blocking members 220a and 220b include a horizontal light blocking members 220a formed in a direction parallel with the gate line 121 and a vertical light blocking member 220b formed in a direction parallel with the data line 171.

A second interlayer insulating layer 180b covering the color filter 230 and the light blocking members 220a and 220b is formed thereon, and the second interlayer insulating layer 180b includes a contact hole 185 for physically and electrically connecting the pixel electrode 191 and the drain electrode 175.

Next, the pixel electrode 191 is formed on the second interlayer insulating layer 180b and a sacrificial layer 300 is formed on the pixel electrode 191. As shown in FIG. 10, an open portion OPN is formed on the data line 171 in the sacrificial layer 300. The open portion OPN may extend along the data line 171.

In a subsequent process, the common electrode 270, and the roof layer 360 are filled in the open portion OPN to form the partition wall formation portion PWP. The common electrode 270 may be made of a transparent conductive material such as ITO or IZO. The roof layer 360 may be an inorganic insulating layer made of an inorganic material such as a silicon nitride (SiNx) or a silicon oxide (SiOx).

Figure 11:
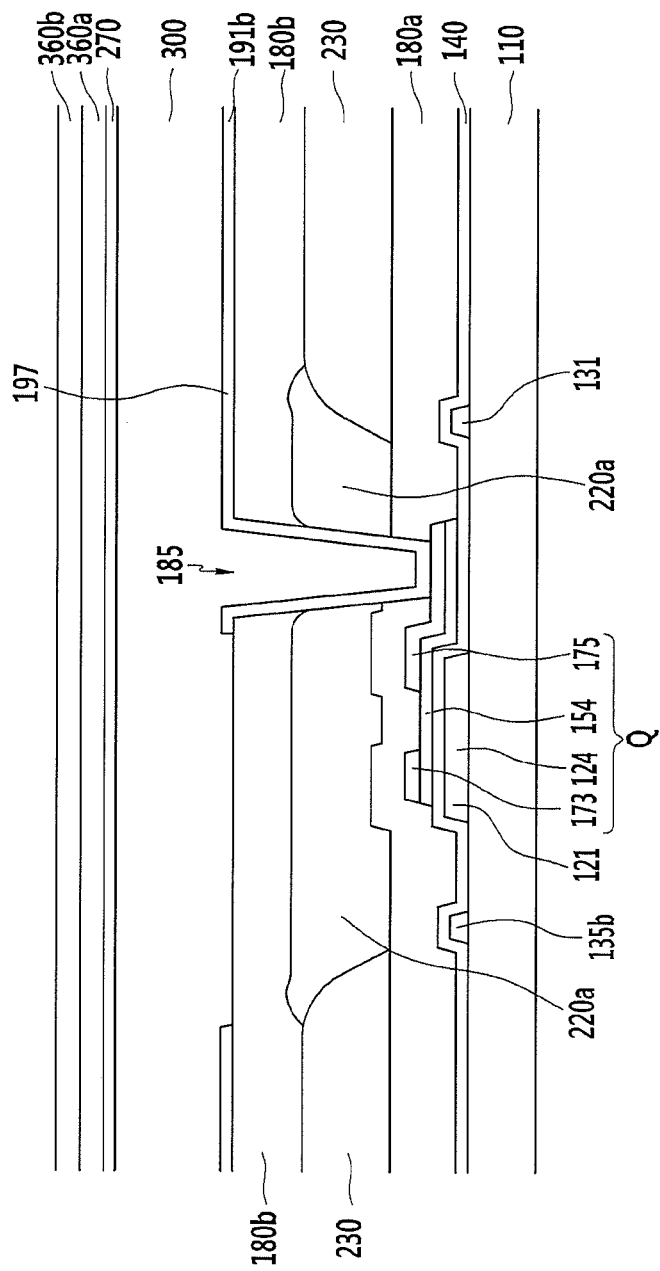
Figure 12:
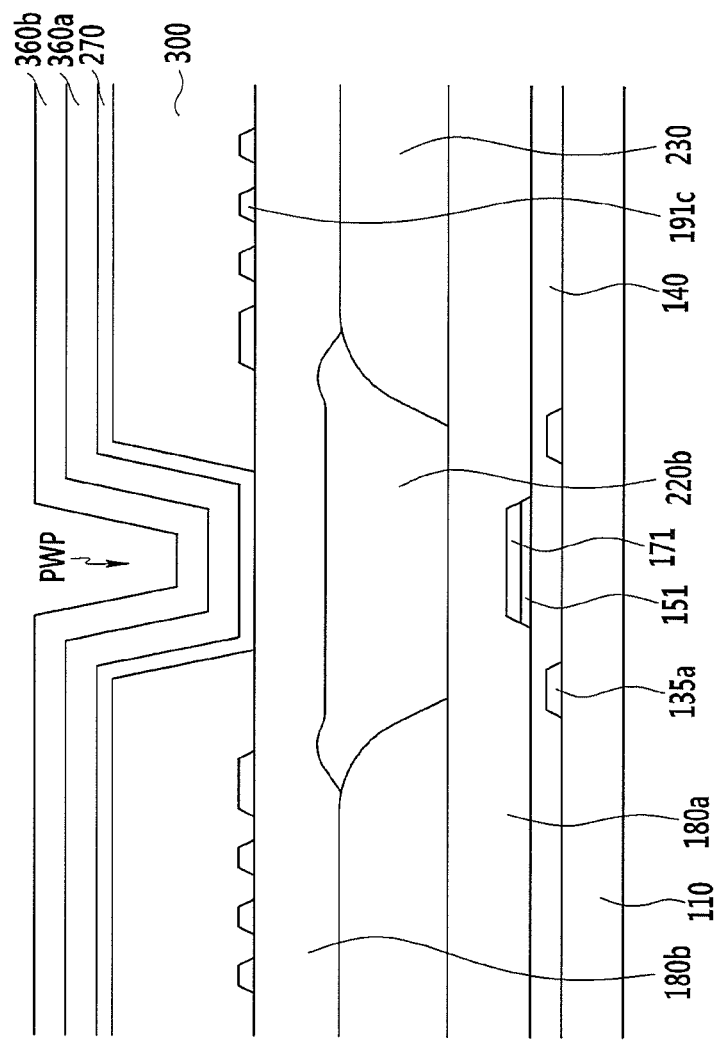

Referring to FIG. 1, FIG. 11, and FIG. 12, the common electrode 270, a first inorganic layer 360a, and a second inorganic layer 360b are sequentially layered on the sacrificial layer 300. The first inorganic layer 360a and the second inorganic layer 360b may be inorganic insulating layers made of an inorganic material such as a silicon nitride (SiNx) or a silicon oxide (SiOx). In the present exemplary embodiment, the first inorganic layer 360a and the second inorganic layer 360b may have different stresses. For example, the first inorganic layer 360a may have a compressive stress and the second inorganic layer 360b may have a tensile stress. Alternatively, the first inorganic layer 360a may have a tensile stress and the second inorganic layer 360b may have a compressive stress. Preferably, the first inorganic layer 360a and the second inorganic layer 360b may be formed of a silicon nitride such as SiNx, and a stress characteristic can be modified by controlling the amount of injection of hydrogen gas when forming the SiNx.

In this case, as shown in FIG. 12, the common electrode 270, the first inorganic layer 360a, and the second inorganic layer 360b may form a partition wall formation portion PWP at the open portion OPN of sacrificial layers 300 that neighbor each other in a horizontal direction.

Figure 13:
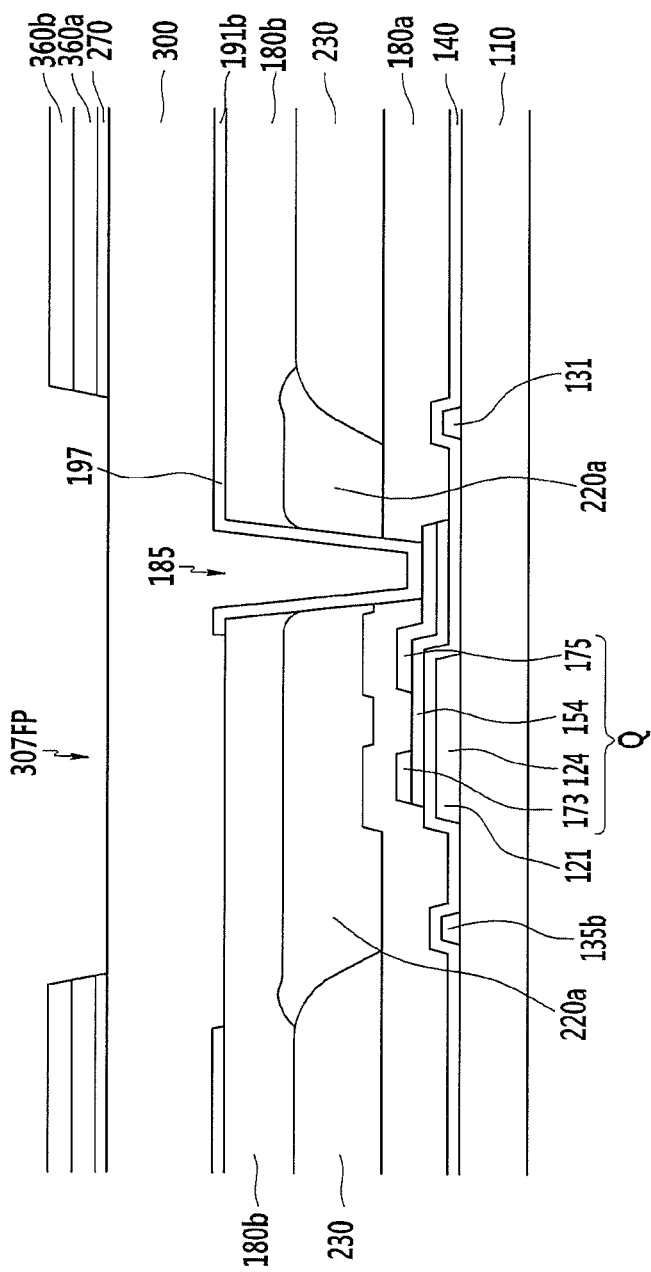

Referring to FIG. 13, the first inorganic layer 360a, the second inorganic layer 360b, and the common electrode 270 may be patterned using the same mask. The first inorganic layer 360a, the second inorganic layer 360b, and the common electrode 270 may be dry-etched. The first inorganic layer 360a, the second inorganic layer 360b, and the common electrode 270 are partially removed so that a liquid crystal injection hole forming region 307FP is formed and thus the sacrificial layer 300 can be exposed.

Figure 14:
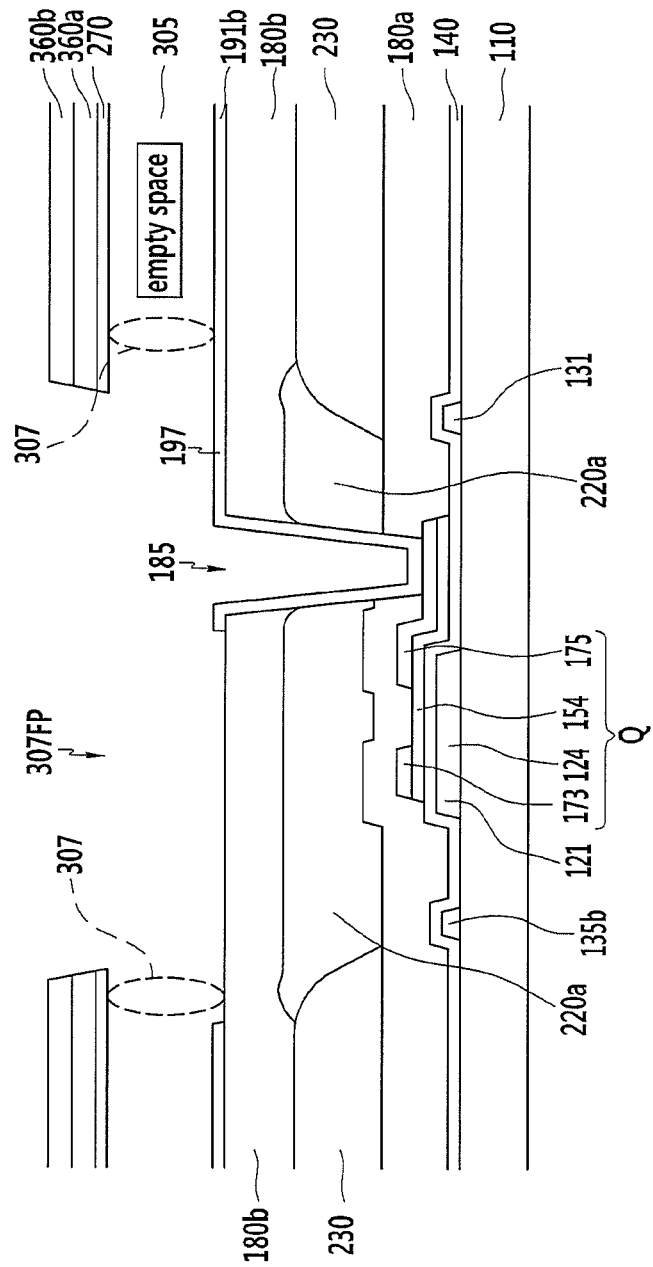
Figure 15:
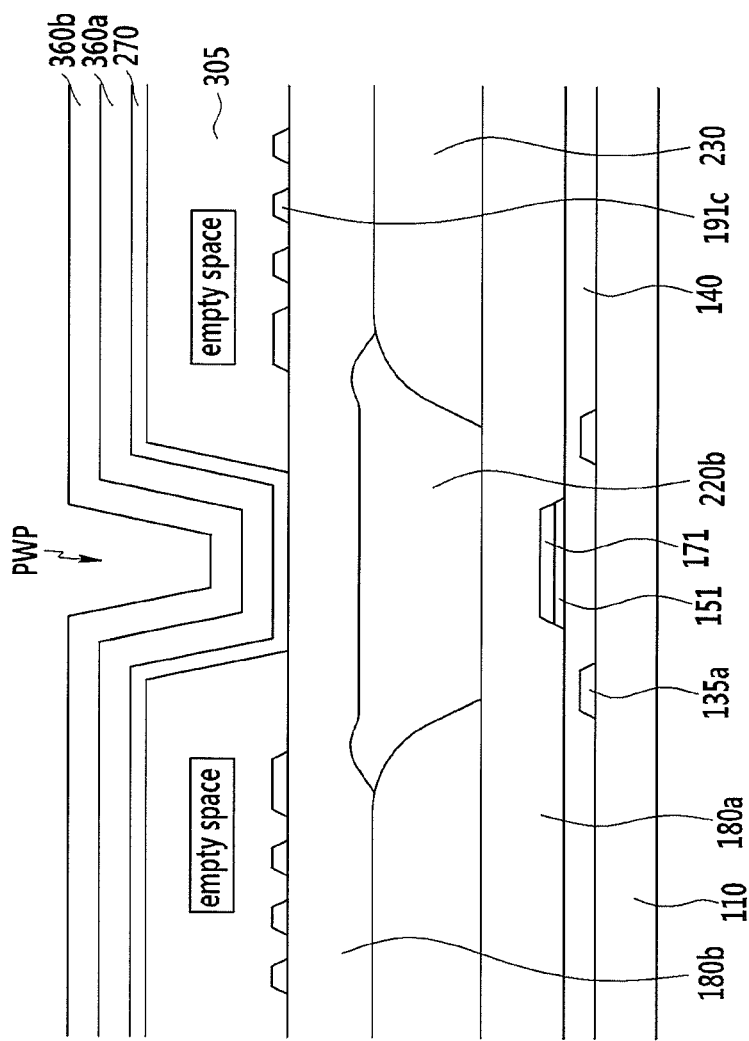

Referring to FIG. 1, FIG. 14, and FIG. 15, the sacrificial layer 300 is removed through an oxygen (02) ashing process or a wet-etching process through the liquid crystal injection hole forming region 307FP. In this case, microcavities 305 having liquid crystal injection holes 307 are formed. The microcavity 305 is an empty space because the sacrificial layer 300 is removed.

Figure 16:
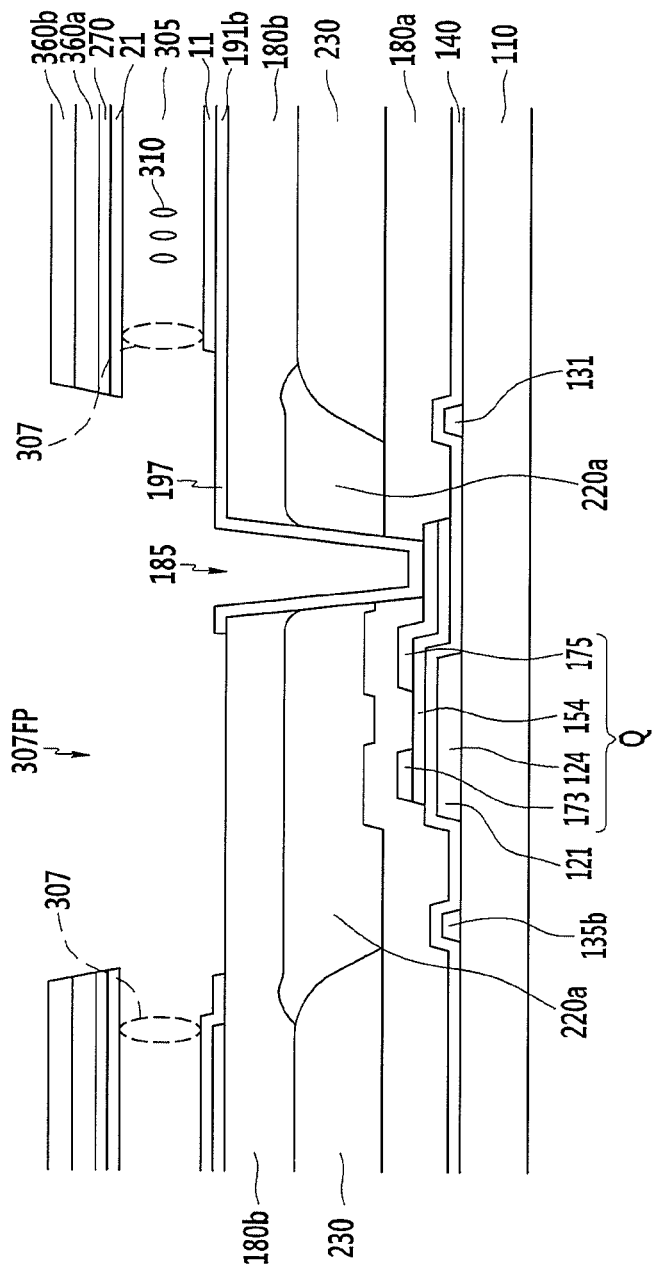
Figure 17:
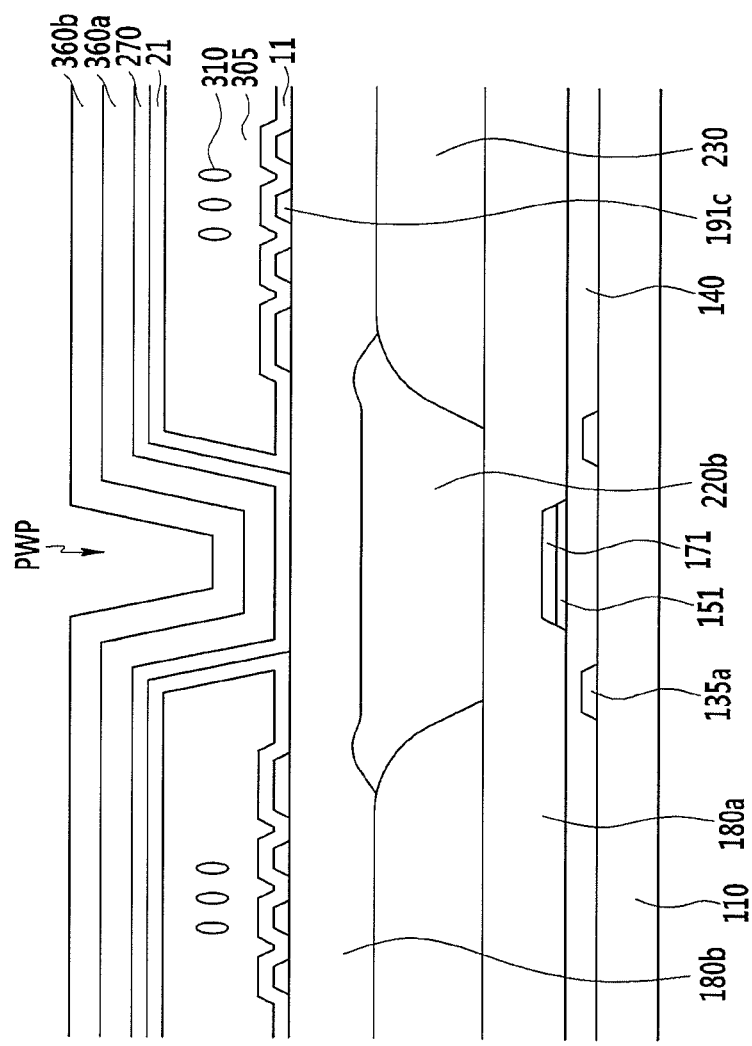

Referring to FIG. 1, FIG. 16, and FIG. 17, an alignment material is injected through the liquid crystal injection hole forming region 307FP and the liquid crystal injection hole 307 to form alignment layers 11 and 21 on the pixel electrode 191 and the common electrode 270. In detail, a bake process is performed after injecting the aligning material including a solid and a solvent through the liquid crystal injection hole 307.

Next, the liquid crystal material including the liquid crystal molecules 310 is injected into the microcavity 305 through the liquid crystal injection hole 307 by using an inkjet method and the like.

Thereafter, the capping layer 390 is formed on the roof layer 360 to cover the liquid crystal injection hole 307 and the liquid crystal injection hole formation region 307FP to form the liquid crystal display illustrated in FIGS. 2 and 3.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

| <Description of Symbols> | |
|---|---|
| 300 sacrificial layer | 305 microcavity |
| 307 liquid crystal injection hole | 360 roof layer |
| 390 capping layer | |

What is claimed is:

1. A liquid crystal display comprising:
a substrate;
a thin film transistor disposed on the substrate;
a pixel electrode connected with the thin film transistor;
a roof layer overlapping the pixel electrode;
a liquid crystal layer disposed in a plurality of microcavities including liquid crystal molecules between the pixel electrode and the roof layer; and
a capping layer disposed on the roof layer,
wherein the roof layer consists of at least two inorganic layers,
wherein the roof layer of the at least two inorganic layers is disposed between the plurality of microcavities, wherein the at least two inorganic layers are layered sequentially, wherein the at least two inorganic layers are disposed on the microcavities and the at least two inorganic layers overlap with the microcavities, and wherein the at least two inorganic layers disposed on the microcavities extend toward a portion between the microcavities adjacent to each other, and the at least two inorganic layers are disposed in the portion between the microcavities adjacent to each other to form a partition wall formation portion.

2. The liquid crystal display of claim 1, wherein the roof layer comprises a structure in which a first inorganic layer and a second inorganic layer, each having a different stress, are layered.

3. The liquid crystal display of claim 2, wherein the first inorganic layer has a compressive stress and the second inorganic layer has a tensile stress.

4. The liquid crystal display of claim 3, wherein the first inorganic layer and the second inorganic layer are alternately layered, and the roof layer comprises at least one of the first inorganic layer and the second inorganic layer.

5. The liquid crystal display of claim 4, wherein a thickness of the first inorganic layer and a thickness of the second inorganic layer are gradually increased farther away from the plurality of microcavities.

6. The liquid crystal display of claim 1, further comprising a common electrode disposed between the plurality of microcavities and the roof layer.

7. The liquid crystal display of claim 1, wherein the partition wall formation portion is covered with the capping layer.

8. The liquid crystal display of claim 7, wherein the partition wall formation portion is along a direction in which a data line connected to the thin film transistor extends.

9. The liquid crystal display of claim 1, wherein a liquid crystal injection hole forming area is disposed between the plurality of microcavities, and the capping layer covers the liquid crystal injection hole forming area.

10. The liquid crystal display of claim 9, wherein the liquid crystal injection hole forming area is along a direction in which a gate line connected to the thin film transistor extends.

11. The liquid crystal display of claim 1, further comprising a common electrode disposed between the plurality of microcavities and the roof layer, wherein the common electrode, the roof layer, and the capping layer are sequentially disposed.

12. A method for manufacturing a liquid crystal display, comprising:

forming a thin film transistor on a substrate;

forming a pixel electrode connected with the thin film transistor;

forming a sacrificial layer on the pixel electrode;

forming a roof layer on the sacrificial layer;

partially exposing the sacrificial layer by patterning the roof layer;

forming a plurality of microcavities by removing the sacrificial layer;

injecting a liquid crystal material into the plurality of microcavities; and forming a capping layer to cover liquid crystal injection holes of the plurality of microcavities, wherein the roof layer consists of at least two inorganic layers, wherein the roof layer of the at least two inorganic layers is disposed between the plurality of microcavities, wherein the at least two inorganic layers are layered sequentially, wherein the at least two inorganic layers are disposed on the microcavities and the at least two inorganic layers overlap with the microcavities, and wherein the at least two inorganic layers disposed on the microcavities extend toward a portion between the microcavities adjacent to each other, and the at least two inorganic layers are disposed in the portion between the microcavities adjacent to each other to form a partition wall formation portion.

13. The method for manufacturing the liquid crystal display of claim 12, wherein the forming the roof layer comprises sequentially layering a first inorganic layer and a second inorganic layer, each having a different stress.

14. The method for manufacturing the liquid crystal display of claim 13, wherein the first inorganic layer is made of a material having a compressive stress and the second inorganic layer is made of a material having a tensile stress.

15. The method for manufacturing the liquid crystal display of claim 14, wherein the forming the roof layer comprises alternately layering the first inorganic layer and the second inorganic layer, and the roof layer comprises at least one of the first inorganic layer and the second inorganic layer.

16. The method for manufacturing the liquid crystal display of claim 15, wherein when forming the roof layer, a thickness of the first inorganic layer and a thickness of the second inorganic layer are gradually decreased farther away from the plurality of microcavities.

17. The method for manufacturing the liquid crystal display of claim 16, further comprising forming a common electrode provided between the sacrificial layer and the roof layer.

18. The method for manufacturing the liquid crystal display of claim 17, wherein the partition wall formation portion is formed along a direction in which a data line connected to the thin film transistor, and the capping layer covers the partition wall formation portion.

19. The method for manufacturing the liquid crystal display of claim 12, wherein when partially exposing the sacrificial layer by patterning the roof layer, a liquid crystal injection hole forming area is formed along a direction in which a gate line connected to the thin film transistor extends, and the capping layer covers the liquid crystal injection hole forming area.

20. The method for manufacturing the liquid crystal display of claim 12, further comprising forming a common electrode on the sacrificial layer, wherein the common electrode and the roof layer are patterned using one mask.

* * * * *